United States Patent
Hovel et al.

(10) Patent No.: US 9,583,658 B2
(45) Date of Patent: Feb. 28, 2017

(54) SOLAR CELL PANELS AND METHOD OF FABRICATING SAME

(75) Inventors: Harold John Hovel, Katonah, NY (US); Rainer Klaus Krause, Kostheim (DE); Xiaoyan Shao, Yorktown Heights, NY (US); Steven Erik Steen, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 847 days.

(21) Appl. No.: 12/849,555

(22) Filed: Aug. 3, 2010

(65) Prior Publication Data

US 2010/0297800 A1 Nov. 25, 2010

Related U.S. Application Data

(62) Division of application No. 12/189,839, filed on Aug. 12, 2008.

(51) Int. Cl.
| | | |
|---|---|---|
| *H01L 31/0224* | (2006.01) | |
| *H01L 31/048* | (2014.01) | |
| *H01L 31/02* | (2006.01) | |
| *H01L 31/05* | (2014.01) | |
| *H01L 31/0475* | (2014.01) | |

(52) U.S. Cl.
CPC ........ *H01L 31/048* (2013.01); *H01L 31/0201* (2013.01); *H01L 31/022433* (2013.01); *H01L 31/0475* (2014.12); *H01L 31/0508* (2013.01); *Y02E 10/50* (2013.01)

(58) Field of Classification Search
CPC .. H01L 31/0488; H01L 31/05; H01L 31/0504
USPC .......................................................... 136/251
See application file for complete search history.

(56) References Cited

U.S. PATENT DOCUMENTS

| | | | | |
|---|---|---|---|---|
| 3,539,883 A | | 11/1970 | Stanley | |
| 3,966,499 A | * | 6/1976 | Yasui | .............. H01L 31/022433 |
| | | | | 136/206 |
| 4,084,985 A | * | 4/1978 | Evans, Jr. | ..................... 136/251 |

(Continued)

FOREIGN PATENT DOCUMENTS

| | | |
|---|---|---|
| JP | 59115576 | 7/1984 |
| JP | 09153634 | 6/1997 |

OTHER PUBLICATIONS

Inakanaka, JP Machine Translation of JP 09-153634, 1997.

*Primary Examiner* — Jennifer Michener
*Assistant Examiner* — Magali P Slawski
(74) *Attorney, Agent, or Firm* — Lieberman & Brandsdorfer, LLC

(57) ABSTRACT

A solar cell panel and method of forming a solar cell panel. The method includes a: forming an electrically conductive bus bar on a top surface of a bottom cover plate; forming an electrically conductive contact frame proximate to a bottom surface of a top cover plate, the top cover plate transparent to visible light; and placing an array of rows and columns of solar cell chips between the bottom cover plate and the top cover plate, each solar cell chip of the array of solar cell chips comprising an anode adjacent to a top surface and a cathode adjacent to a bottom surface of the solar cell chip, the bus bar electrically contacting each cathode of each solar cell chip of the array of solar cell chips and the contact frame contacting each anode of each solar cell chip of the array of solar cell chips.

10 Claims, 7 Drawing Sheets

(56) References Cited

U.S. PATENT DOCUMENTS

| | | | | |
|---|---|---|---|---|
| 4,328,390 | A | * | 5/1982 | Meakin et al. ............... 136/259 |
| 4,727,047 | A | * | 2/1988 | Bozler et al. ................ 438/464 |
| 4,756,796 | A | * | 7/1988 | Saitou .......................... 264/162 |
| 4,771,017 | A | * | 9/1988 | Tobin et al. .................... 438/98 |
| 5,158,618 | A | * | 10/1992 | Rubin et al. ................. 136/244 |
| 6,784,358 | B2 | | 8/2004 | Kukulka |
| 2002/0000561 | A1 | | 1/2002 | Yamagata et al. |
| 2003/0006697 | A1 | * | 1/2003 | Weaver ......................... 313/503 |
| 2004/0093809 | A1 | * | 5/2004 | Winarski ..................... 52/173.3 |
| 2005/0000561 | A1 | * | 1/2005 | Baret et al. ................... 136/244 |
| 2005/0074898 | A1 | * | 4/2005 | Datwani et al. .............. 436/180 |
| 2006/0166480 | A1 | * | 7/2006 | Yun et al. ..................... 438/618 |
| 2008/0014661 | A1 | | 1/2008 | Haag et al. |
| 2008/0110492 | A1 | * | 5/2008 | Buller et al. ................. 136/251 |
| 2009/0183768 | A1 | * | 7/2009 | Wenham et al. ............. 136/256 |

\* cited by examiner

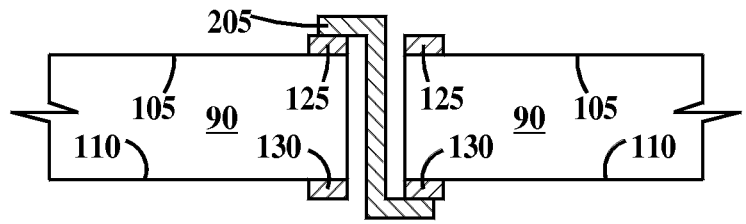
*FIG. 9*
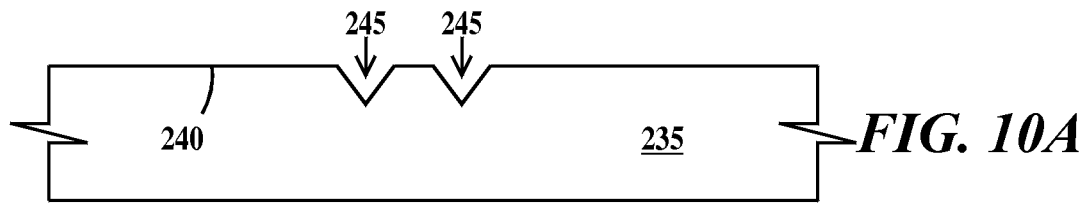
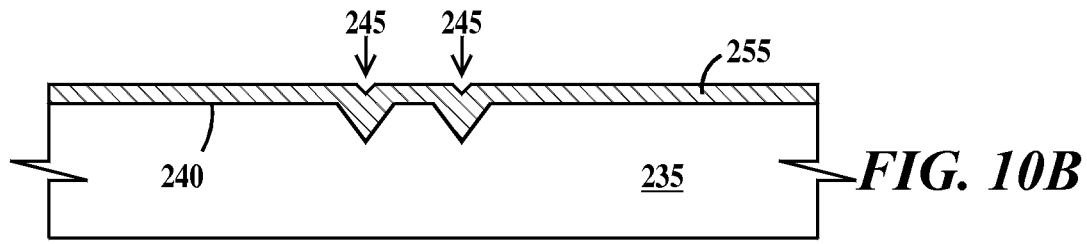
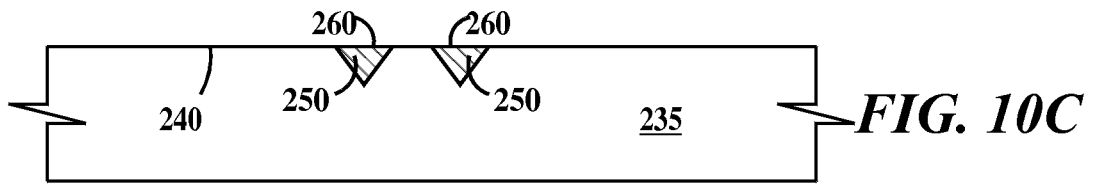
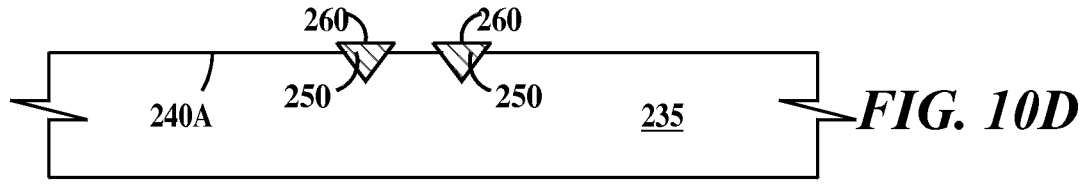
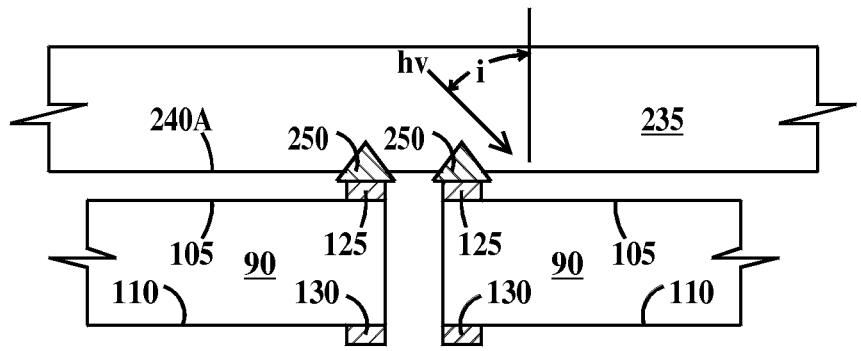
*FIG. 11*

US 9,583,658 B2

SOLAR CELL PANELS AND METHOD OF FABRICATING SAME

CROSS REFERENCE TO RELATED APPLICATION(S)

This application is a division of application Ser. No. 12/189,839, filed Aug. 12, 2008, now pending, which is hereby incorporated herein by reference.

FIELD OF THE INVENTION

The present invention relates to the field of solar cell panels; more specifically, it relates to solar cell panels and methods of fabricating solar cell panels.

BACKGROUND OF THE INVENTION

Solar cell panels require many steps to fabricate and it is relatively expensive for a manufacturer to supply more than a few voltage/current combination solar cell panels. Accordingly, the industry would welcome reductions in solar cell panel fabrication costs and increased solar cell panel fabrication flexibility. Therefore there exists a need in the art to mitigate the deficiencies and limitations described hereinabove.

SUMMARY OF THE INVENTION

One aspect of the present invention is a method, comprising: forming an electrically conductive bus bar on a top surface of a bottom cover plate; forming an electrically conductive contact frame proximate to a bottom surface of a top cover plate, the top cover plate transparent to visible light; and placing an array of rows and columns of solar cell chips between the bottom cover plate and the top cover plate, each solar cell chip of the array of solar cell chips comprising an anode adjacent to a top surface and a cathode adjacent to a bottom surface of the solar cell chip, the bus bar electrically contacting each cathode of each solar cell chip of the array of solar cell chips and the contact frame contacting each anode of each solar cell chip of the array of solar cell chips.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 1A is a cross-sectional view through line 1A-1A of FIGS. 1B and 1C, wherein

FIG. 9 is a detailed view of features of FIG. 7;

FIGS. 10A, 10B, 10C and 10D are cross-sectional views illustrated a method of forming a top cover plate according to embodiments of the present invention;

FIG. 11 is a cross-sectional view of a solar cell panel assembled using the top cover plate of FIG. 10D;

DETAILED DESCRIPTION OF THE INVENTION

Figure 1A:
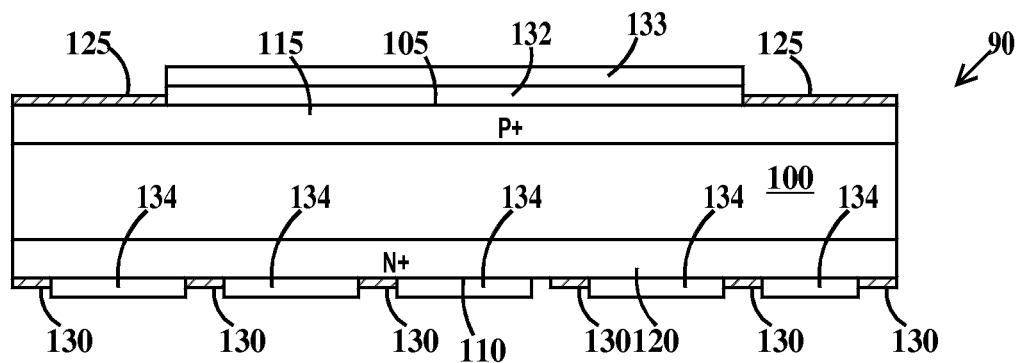
Figure 1B:
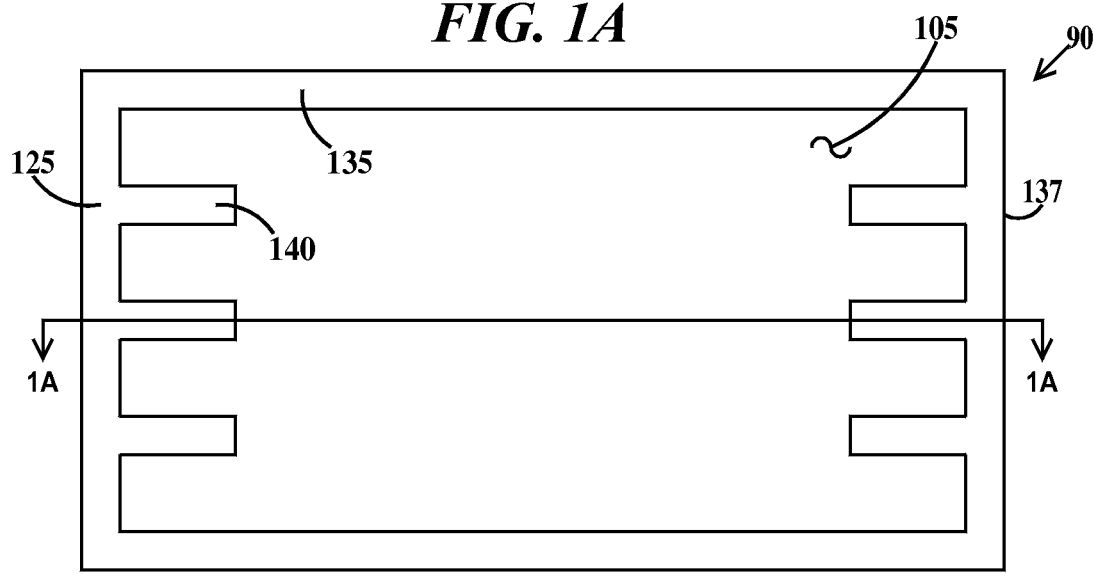
FIG. 1B is a top view and FIG. 1C is a bottom view of an exemplarily solar cell chip according to the present invention.
Figure 1C:
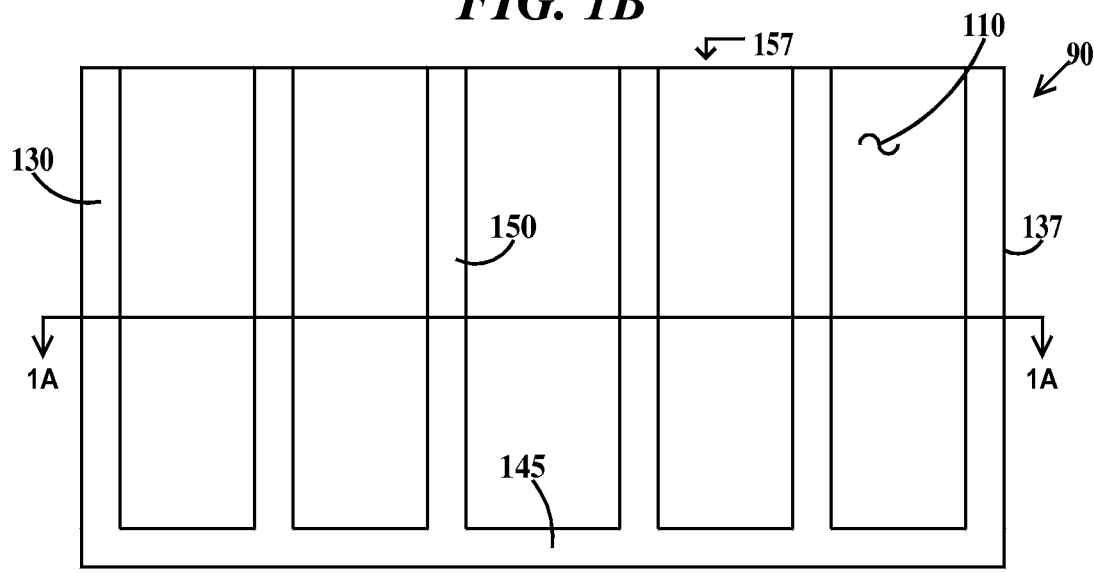

FIG. 1A is a cross-sectional view through line 1A-1A of FIGS. 1B and 1C, wherein FIG. 1B is a top view and FIG. 1C is a bottom view of an exemplarily solar cell chip according to the present invention. In FIG. 1A, a solar cell chip 90 is formed from a silicon substrate 100 having a top surface 105 and a bottom surface 110. Formed in substrate 100 adjacent to top surface 110 105 is a P-type doped region 115 and formed in substrate 100 adjacent to bottom surface 110 is an N-type doped region 120. An optional metal silicide contact 125 is formed to P-type doped region 115 and an optional metal silicide contact 130 is formed to N-type doped region 120. P-type doped region 115 is the anode (or anode layer) and N-type doped region 120 is the cathode (or cathode layer) of a PIN (P-doped/Intrinsic/N-doped) diode comprising P-doped region 125, N-doped region 130 and that region of substrate 100 between the N and P doped regions. Substrate 100 may be intrinsic (i.e., undoped) but also may be doped P-type to a doping level less than that of P-doped region 115. An optional top dielectric passivation layer 132 may be formed on top surface 105 where top surface 105 is not covered by metal silicide contact 125. An optional dielectric antireflective coating (ARC) 133 may be formed on top passivation layer 132 if present or on top surface 105 where top surface 105 is not covered by metal silicide contact 125 if there is no top passivation layer. An optional bottom dielectric passivation layer 134 may be formed on bottom surface 110 where bottom surface 110 is not covered by metal silicide contact 130. If there is no metal silicide contact 125 and there is a passivation layer 132 and/or an antireflective coating 133, an equivalent (to metal silicide contact 125) area of P-doped region 115 is left uncovered by passivation layer 132 and/or an antireflective coating 133. If there is no metal silicide contact 130 and there is a passivation layer 1, an equivalent (to metal silicide contact 130) area of N-doped region 120 is left uncovered by passivation layer 134.

In FIG. 1B, it can be seen that silicide contact 125 comprises a peripheral region 135 adjacent to a perimeter 137 of solar cell chip 90, the peripheral region having integral fingers 140 extending from peripheral region 135 toward the interior of substrate 100 along surface 105. The geometric shape of the footprint of silicide contact 125 as illustrated in FIG. 1B is exemplary and other shapes (e.g., without fingers or having fingers on all four sides instead of two as illustrated) may be substituted.

In FIG. 1C, it can be seen that silicide contact 130 comprises a peripheral region 145 adjacent to a an edge 147 of solar cell chip 90 having integral fingers 150 extending from edge 147 across top surface 105 of substrate 100 to a side 157 opposite side 147. The geometric shape of the footprint of silicide contact 130 as illustrated in FIG. 1C is exemplary and other shapes (e.g., without fingers, a ring along perimeter 137 or as a ring having fingers) may be substituted.

While illustrated as rectangular in FIGS. 1B and 1C, solar cell chip 90 may be square. In one example, solar cell chip 90 has a top surface (105) area of between about 25 mm$^2$ and about 400 mm$^2$. Solar cell chips according to the embodiments of the present invention do not include bus bars or contact frames. Since metal silicide contacts 125 and 130 are optional, it should be understood that hereinafter when reference is made to an element contacting metal silicide contacts 125 or 130, the element may respectively contact P-doped region 115 or N-doped region 120 instead.

Figure 2A:
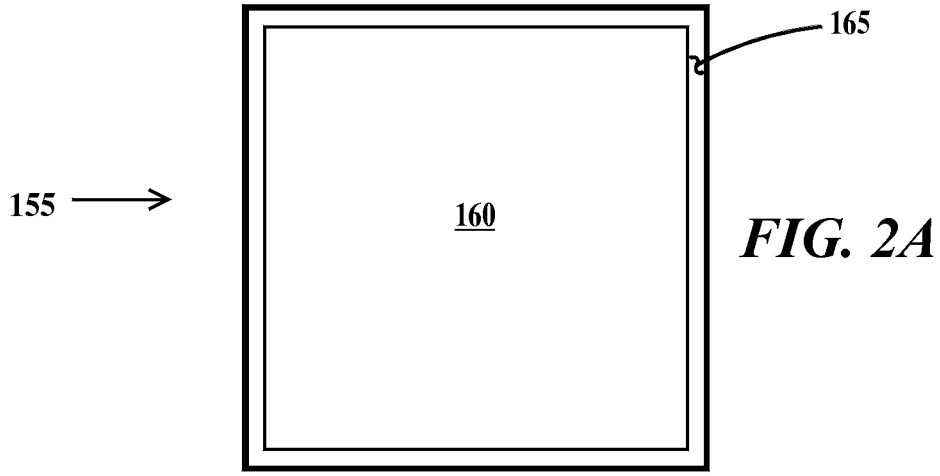
FIGS. 2A, 2B and 2C are views of components of a solar cell panel according to a first embodiment of the present invention.
Figure 2B:
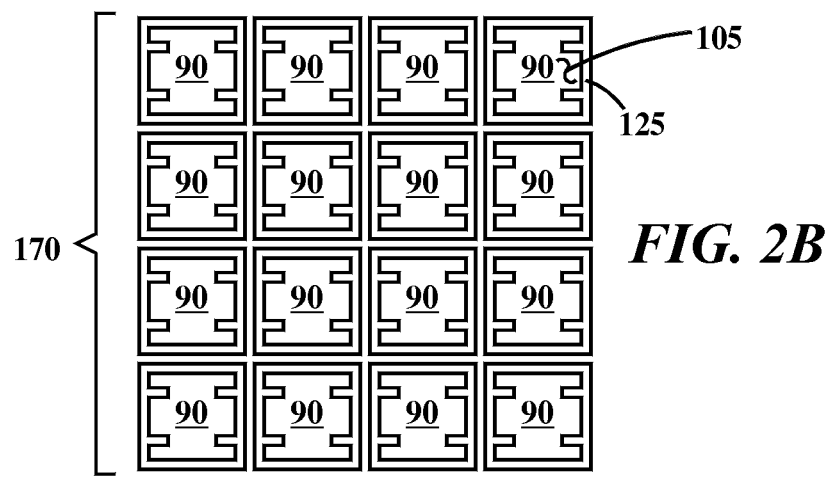
Figure 2C:
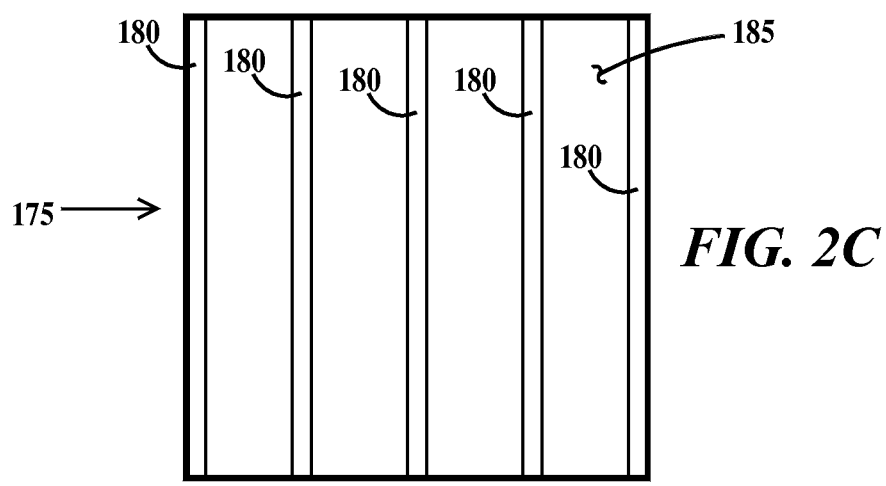

FIGS. 2A, 2B and 2C are views of components of a solar cell panel according to a first embodiment of the present invention. FIGS. 2A, 2B and 2C illustrate an embodiment in which all solar cell chips of a solar cell panel are connected in parallel. In FIG. 2A, a bottom cover plate 155 (e.g., glass, quartz, plastic) has an electrically conductive plate 160 formed on a top surface 165 of plate 155. In one example, plate 160 comprises a material selected from the group consisting of copper (Cu), aluminum (Al), molybdenum (Mo), zinc oxide (ZnO), zinc-aluminum oxide (ZnAlO) and tin oxide (SnO). In one example, plate 160 comprises a transparent (e.g., to visible light) conducting material (TCM) examples of which include ZnO and ZnAlO. In one example, plate 160 comprises a transparent (e.g., to visible light) conducting oxide (TCO) examples of which include ZnO and ZnAlO. Plate 160 may be formed by screen printing an electrically conductive paste, evaporation, sputter deposition, chemical-vapor-deposition (CVD) or plating onto a thin seed layer formed by evaporation or sputter deposition. Plate 160 may be considered a bus bar, which has been formed on bottom cover plate 155 rather than on solar cell chips 90. Normally bus bars are formed directly on solar cell chips causing shadowing of about 2% of the incident light.

In FIG. 2B a set 170 of solar cell chips 90 are arranged in an exemplary 4 by 4 array with all top surfaces 105 facing up. An N by M array of solar cell chips may be substituted to comply with the length and width of bottom cover plate 155 (see FIG. 2A) where N and M are both independently integers greater or equal to 1. Solar panel chips 90 do not touch each other.

In FIG. 2C, a top cover plate 175 (e.g., glass, quartz, plastic) has a set of parallel electrically conductive lands 180 formed on a bottom surface 185 of plate 175. Lands 180 may comprise any of the materials discussed supra with respect to plate 160 of FIG. 2A. Lands 180 may be formed by screen printing an electrically conductive paste, sputter deposition through a metal mask, by subtractive etch of a layer formed by sputter deposition, evaporation, CVD or plating, or by a damascene process. A damascene process is described infra. Lands 180 may be considered a contact frame, which has been formed on top cover plate 175 rather than on solar cell chips 90. Normally contact frames are formed directly on solar cell chips.

Alternatively, plate 160 (see FIG. 2A) may be replaced by a series of parallel electrically conductive lands running orthogonal to lands 180 (see FIG. 2C) in which case provision for connecting each land (those replacing plate 160) in parallel is made.

Figure 4:
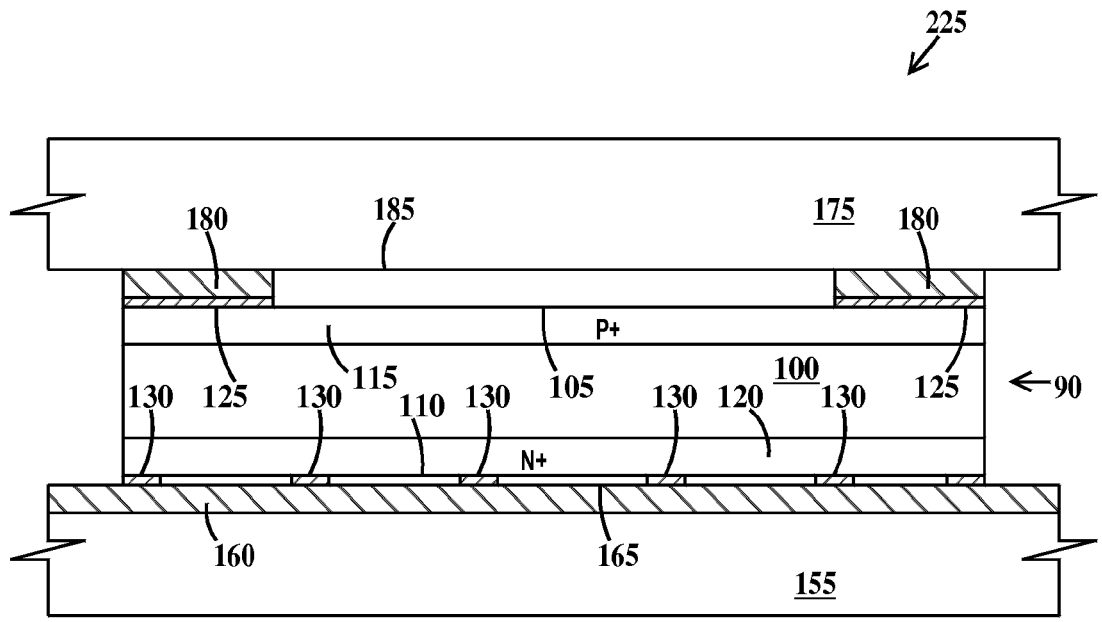
FIG. 4 is a cross-sectional view through a solar cell panel after assembly of the components illustrated in FIGS. 2A, 2B and 2C.

Turning to FIG. 4, FIG. 4 is a cross-sectional view through a solar cell panel after assembly of the components illustrated in FIGS. 2A, 2B and 2C. In FIG. 4, only one solar cell chip 90 of the set 170 of solar cell chips 90 of FIG. 2B are illustrated. In FIG. 4, solar cell chips 90 have been placed between bottom cover plate 155 and top cover plate 175 to form a solar cell panel assembly 225. Top surface 165 of bottom cover plate 155 faces bottom surfaces 110 of solar cell chips 90 and plate 160 of the bottom cover plate electrically contacts metal silicide contacts 130 of the solar cell chips. Bottom surface 185 of top cover plate 175 faces top surfaces 105 of solar cell chips 90 and lands 180 of the top cover plate electrically contacts metal silicide contacts 125 of the solar cell chips.

Figure 6:
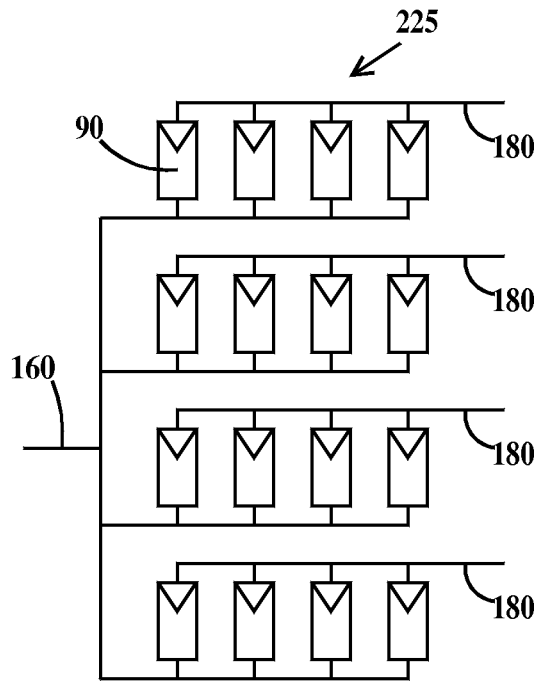
FIG. 6 is a schematic diagram of the circuit of the solar cell panel assembly of FIG. 4 are assembly.

Turning to FIG. 6, FIG. 6 is a schematic diagram of the circuit of the solar cell panel assembly of FIG. 4. In FIG. 6, it can be see that the anode of each solar cell 90 is connected to a land 180 and the cathodes of each solar cell chip 90 are connected to plate 160. There is one land 180 for each row of solar cell chips 90. In a completed solar cell panel, all the lands 180 are electrically connected together.

Figure 3A:
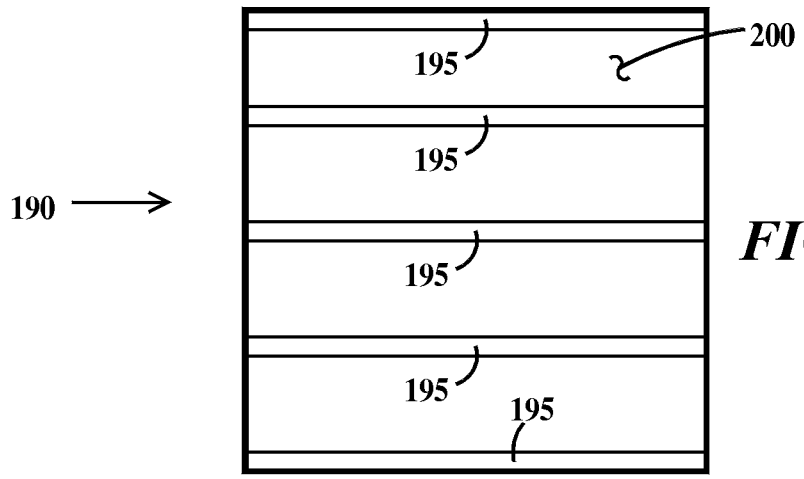
FIGS. 3A, 3B and 3C are views of components of a solar cell panel according to a second embodiment of the present invention.
Figure 3B:
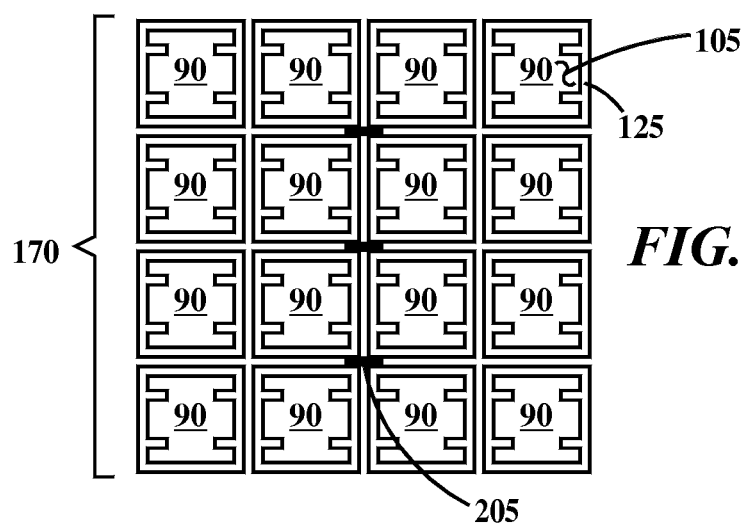
Figure 3C:
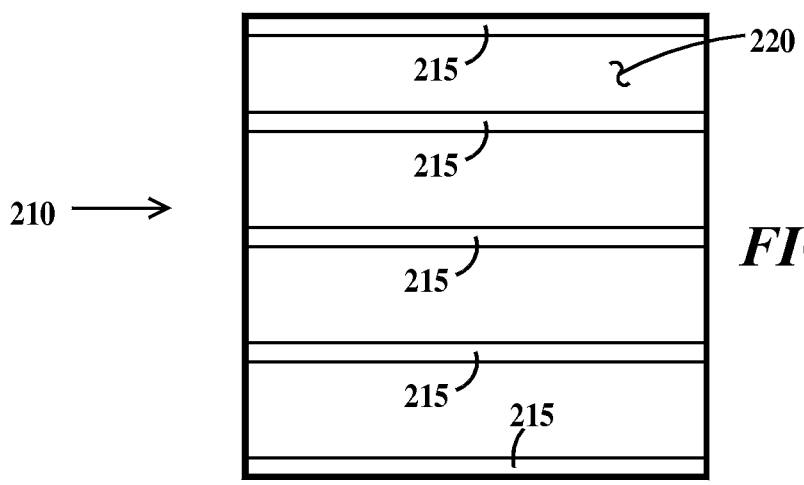

Turning to FIGS. 3A, 3B and 3C, FIGS. 3A, 3B and 3C are views of components of a solar cell panel according to a second embodiment of the present invention. FIGS. 3A, 3B and 3C illustrate an embodiment in which solar chips in each row are connected in parallel and each row is connected in series. In FIG. 3A, a bottom cover plate 190 (e.g., glass, quartz, plastic) has an electrically conductive lands 195 formed on a top surface 200 of plate 190. In one example, lands 195 comprises a material selected from the group consisting of Cu, Al, Mo, ZnO, ZnAlO and SnO. In one example, lands 195 comprises a TCM) examples of which were listed supra. In one example, lands 195 comprises a TCO examples of which were listed supra. Lands 195 may be formed by screen printing an electrically conductive paste, sputter deposition through a metal mask, by subtractive etch of a layer formed by sputter deposition, evaporation, CVD or plating, or by a damascene process. Lands 195 may be considered a bus bar, which has been formed on bottom cover plate 190 rather than on solar cell chips 90.

In FIG. 3B a set 170 of solar cell chips 90 are arranged in an exemplary 4 by 4 array with all top surfaces 105 facing up. An N by M array of solar cell chips may be substituted to comply with the length and width of bottom cover plate 190 (see FIG). In FIG. 3B, electrically conductive clips 205 are positioned between each row of solar cell chips 90. See FIG. 9 for a detailed drawing how chips 205 electrically interconnect solar cell chips 90. Solar panel chips 90 do not touch each other.

In FIG. 3C, a top cover plate 210 (e.g., glass, quartz, plastic) has a set of parallel electrically conductive lands 215 formed on a bottom surface 220 of plate 210. Lands 215 may comprise any of the materials discussed supra with respect to lands 195 of FIG. 3A. Lands 215 may be formed by screen printing an electrically conductive paste, sputter deposition through a metal mask, by subtractive etch of a layer formed by sputter deposition, evaporation, CVD or plating, or by a damascene process. Lands 215 may be considered a contact frame, which has been formed on top cover plate 210 rather than on solar cell chips 90.

In FIG. 3C, a top cover plate 210 (e.g., glass, quartz, plastic) has a set of parallel electrically conductive lands 215 formed on a bottom surface 220 of plate 210. Lands 215 may comprise any of the materials discussed supra with respect to lands 195 of FIG. 3A. Lands 215 may be formed by screen printing an electrically conductive paste, sputter deposition through a metal mask, by subtractive etch of a layer formed by sputter deposition, evaporation, CVD or plating, or by a damascene process. Lands 215 may be considered a contact frame, which has been formed on bottom cover plate 220 rather than on solar cell chips 90.

Figure 5:
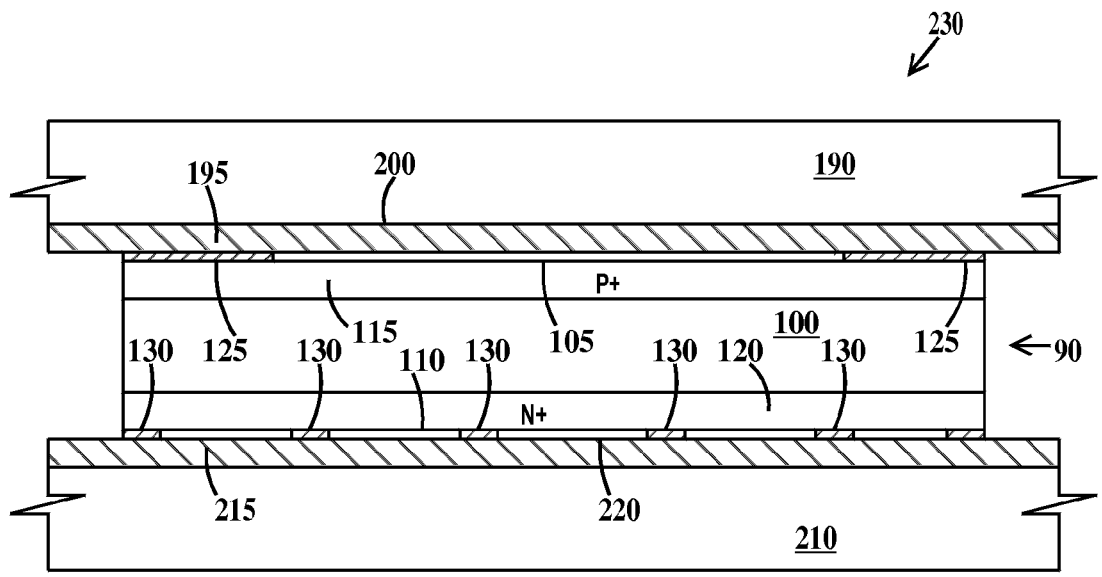
FIG. 5 is a cross-sectional view through a solar cell panel after assembly of the components illustrated in FIGS. 3A, 3B and 3C.

Turning to FIG. 5, FIG. 5 is a cross-sectional view through a solar cell panel after assembly of the components illustrated in FIGS. 3A, 3B and 3C. In FIG. 5, only one solar cell chip 90 of the set 170 of solar cell chips of FIG. 3B are illustrated. In FIG. 5, solar cell chips 90 have been placed between bottom cover plate 210 and top cover plate 190 to form a solar cell panel assembly 230. Top surface 220 of bottom cover plate 210 faces bottom surfaces 110 of solar cell chips 90 and lands 215 of the bottom cover plate electrically contacts metal silicide contacts 130 of the solar cell chips. Bottom surface 200 of top cover plate 190 faces top surfaces 105 of solar cell chips 90 and lands 195 of the top cover plate electrically contacts metal silicide contacts 125 of the solar cell chips. Lands 195 and 215 are arranged parallel to each other.

Figure 7:
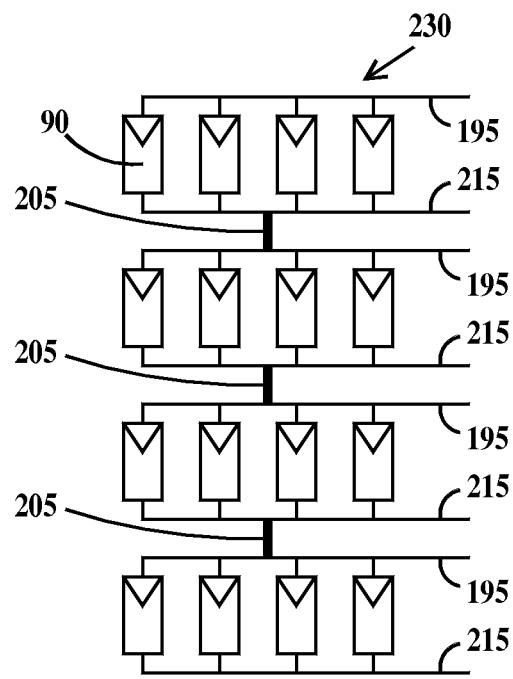
FIG. 7 is a schematic diagram of the circuit of the solar cell panel assembly of FIG. 5 are assembly.

Turning to FIG. 7, FIG. 7 is a schematic diagram of the circuit of the solar cell panel assembly of FIG. 5. In FIG. 7, it can be see that the anode of each solar cell 90 of any given row is connected to a land 195 and the cathodes of each solar cell chip 90 of any given row are connected to a land 215. There is a respective land 195 for each row of solar cell chips 90 and a respective land 215 for each row of solar chips 90. In a completed solar cell panel, all the lands 195 are electrically connected together and lands 215 are electrically connected together. Clips 205 connect lands 215 to lands 195 of adjacent rows. While clips 205 contact the top surfaces of contacts 125 and 130, alternatively clips 205 may contact the sides of contacts 125 and 130.

Figure 8:
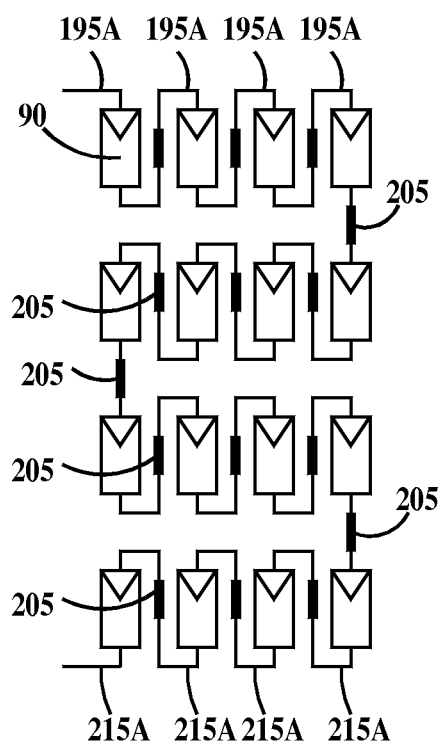
FIG. 8 is a schematic diagram of the circuit of a solar cell panel assembly with all solar cell chips connected in series.

FIG. 8 is a schematic diagram of the circuit of a solar cell panel assembly with all solar cell chips connected in series. In FIG. 8, conductive lands 195A (which are segmented versions of conductive lands 195 of FIG. 3A) are connected by clips 205 to conductive lands 215A (which are segmented versions of conductive lands 215 of FIG. 3C).

FIG. 9 is a detailed view of features of FIG. 7. In FIG. 9, clip 205 electrically connects metal silicide contact 125 of a first solar panel chip to metal silicide contact 130 of a second and adjacent solar panel chip 90. Solar panel chips 90 do not touch each other. Clips 205 are placed to contact regions of metal silicide contacts 125 and 130 so as not to interfere with the electrical connection between metal silicide contacts 125 and 130 and the layers and lands on the top and bottom cover plates (not shown in FIG. 9) in the solar cell panel assembly.

A damascene process is one in which trenches are formed in a dielectric layer, an electrical conductor of sufficient thickness to fill the trenches is deposited on a top surface of the dielectric and in the trenches, and a chemical-mechanical-polish (CMP) process is performed to remove excess conductor and make the surface of the conductor co-planar with the surface of the dielectric layer to form damascene lands. Most commonly when trenches are formed by a photolithography/reactive ion etch process, the trenches are essentially rectangular or trapezoidal in cross-section.

A photolithographic process is one in which a photoresist is applied to a surface to form a photoresist layer, the photoresist layer exposed to actinic radiation through a patterned photomask and the exposed photoresist layer developed to form a patterned photoresist layer. After further processing (e.g., an etch), the patterned photoresist is removed. The photoresist layer may optionally be baked at one or more of prior to exposure to actinic radiation, between exposure to actinic radiation and development, after development.

FIGS. 10A, 10B, 10C and 10D are cross-sectional views illustrated a method of forming a top cover plate according to embodiments of the present invention. In FIG. 10A a top cover plate 235 has a top surface 240. V-groove trenches 245 are formed in bottom cover plate 240 adjacent to top surface 240. In one example, V-groove trenches 245 are formed by mechanical means such scoring or grinding. In FIG. 10B, a layer 255 of an electrically conductive material (e.g., metal, electrically conductive oxide, TCM or TCO) is formed on bottom surface 240, filling groves 245. In FIG. 10C, a CMP is performed to form lands 250. Lands 250 each have a triangular cross section having a base side 260 and two adjacent sides. Base sides 260 are coplanar with bottom surface 240 of top cover plate 235. An apex of each of lands 250 formed by the intersection of the adjacent sides and is embedded in top cover plate 235. In FIG. 10D, an optional recess process has been performed to form a new bottom surface 240A of top cover plate 235 recessed below base sides 260 of lands 250.

FIG. 11 is a cross-sectional view of a solar cell panel assembled using the top cover plate of FIG. 10D. In FIG. 11 lands 250 contact metal silicide contacts 125 of solar cell chips 90. Because of the V-shape of lands 250, shadowing of light incident at angles i of greater than 0° by lands 250 is reduced or eliminated.

Figure 12:
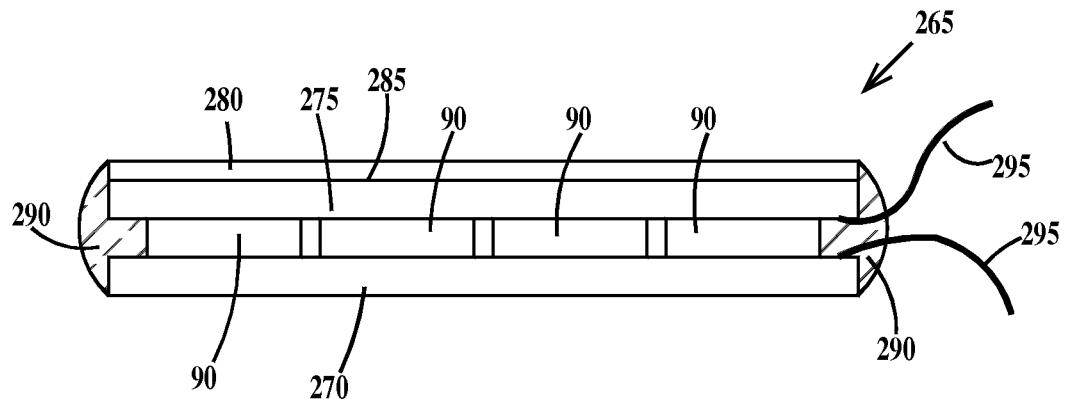
FIG. 12 is a cross-sectional view illustrating encapsulation of a solar cell panel according to any of the embodiments of the present invention.

FIG. 12 is a cross-sectional view illustrating encapsulation of a solar cell panel according to any of the embodiments of the present invention. In FIG. 12, a solar cell panel 265 includes a stack comprising a lower cover plate 270 (e.g., plate 175 of FIG. 2C or plate 220 of FIG. 3C), solar cell chips 90 and a top cover plate 275 (e.g. plate 165 of FIG. 2A or plate 200 of FIG. 3A). An optional ARC 280 has been applied to a top surface 285 of top cover plate 275. An encapsulant 290 seals the edges of top and bottom plates 270 and 275 together and hermetically seals solar cell chips 90 as well. Wires 295 extending through encapsulant 290 are connected to solar cell chips 90 as described supra. One of wires 295 is connected to the anodes and one of wires 295 is connected to the cathodes of solar cell chips 90.

Figure 13:
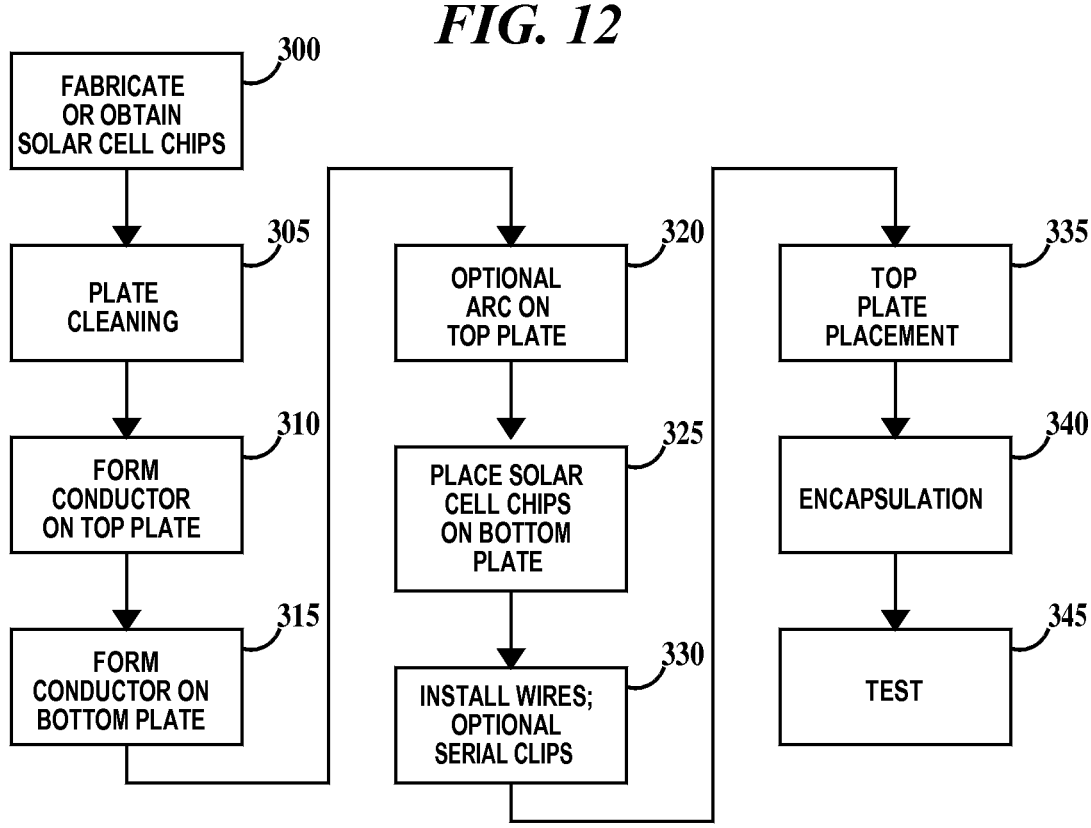
FIG. 13 is a flowchart illustrating the fabrication steps for fabricating solar cell panels according to embodiments of the present invention.

FIG. 13 is a flowchart illustrating the fabrication steps for fabricating solar cell panels according to embodiments of the present invention. In FIG. 300, solar cell chips as described supra are fabricated or otherwise obtained. In step 305, top and bottom cover plates are cleaned. In step 310, top conductors (e.g., lands) are formed on a surface of the top cover plate. In step 315, bottom conductors (e.g., lands or a layer) are formed on a surface of the bottom cover plate. In step 320, an optional ARC is applied to the top cover plate on the surface opposite from that having the lands. The order of steps 315 and 320 may be reversed. In step 325, solar cell chips are placed on the top surface of the bottom cover plate (alternatively on the bottom of the top cover plate). In step 330, lead wires and optional serial clips are put in position. In step 335, the top cover plate (alternatively the bottom cover plate) is placed on the solar cell chips to form a solar cell panel assembly. In step 340, the solar cell panel assembly is encapsulated to form a completed solar cell panel and in step 345 the completed solar cell panel is tested.

Thus the embodiments of the present invention, by forming metal wires on the glass overlay panels using fabrication techniques that allow selection of predefined voltage/current combination, mitigate the deficiencies and limitations described supra.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
    forming a top cover plate having a top distal end and a top proximal end, wherein the top cover plate is transparent to visible light;
    forming a contact frame on a bottom surface of the top cover plate, the contact frame comprising a first set of parallel electrically conductive lands, wherein each land of the first set is comprised of a transparent conducting material, and wherein each land of the first set is a rectangular shape bounded on a first side by the proximal end of the top cover plate, and on a second side by the distal end of the top cover plate, each land in communication with the bottom surface of the top cover plate, and having a height extending from the bottom surface of the top cover plate;
    forming bus bar on a top surface of a bottom cover plate, the bus bar comprising a second set of parallel electrically conductive lands, wherein each land of the second set is a rectangular shape bounded on a first side by a proximal end of the bottom cover plate, and on a second side by a distal end of the bottom cover plate; and
    placing an array of rows and columns of solar cell chips between the bottom cover plate and the top cover plate following the formation of the contact frame and the bus bar, each solar cell chip of the array of solar cell chips comprising an anode adjacent to a top surface and a cathode adjacent to a bottom surface of the solar cell chip, wherein the bus bar electrically contacts each cathode of each solar cell chip of the array of solar cell chips and the contact frame contacts each anode of each solar cell chip of the array of solar cell chips forming an opening between adjacent contact frames, the opening extending from the bottom surface of the top cover plate to the top surface of the chip and extending at least the height of the lands.

2. The method of claim 1, wherein the top surface of the bottom cover plate is facing the bottom surfaces of each solar cell chip of the array of solar cell chips, and the bottom surface of the top cover plate is facing the top surfaces of each solar cell chip of the array of solar cell chips.

3. The method of claim 1, further comprising encapsulating all edges of the top and bottom cover plates, and hermetically sealing the array of solar cell chips between the top and bottom cover plates.

4. The method of claim 1, wherein the bus bar comprises a single plate contacting the cathodes of each solar cell chip of the array, and wherein the anodes of all solar cell chips of a row of solar cell chips are interconnected by a respective land of the first set of lands.

5. The method of claim 1:
    wherein the anodes of all solar cell chips of a row of solar cell chips are interconnected by a respective land of the first set of lands; and
    wherein the cathodes of all solar cell chips of a same row of solar cell chips are interconnected by a respective land of the second set of second lands, and wherein the first and second sets of parallel lands are mutually parallel; and
    further comprising placing electrically conductive clips to electrically connect lands of the first set of lands to lands of the second set of lands between adjacent rows of solar cell chips.

6. The method of claim 1, further comprising forming an antireflective coating on one or more surfaces selected from the group consisting of: the top surfaces of each solar cell chip of the array, a top surface of the top cover plate, and any combination thereof.

7. The method of claim 1, wherein forming the contact frame comprises:
    forming trenches in the top cover plate, the trenches open to the bottom surface of the top cover plate;
    forming a layer of electrically conductive material on the bottom surface of the top cover plate, the electrically conductive material filling the trenches; and
    removing the electrically conductive material from the bottom surface of the top cover plate, the electrically conductive material remaining in the trenches.

8. The method of claim 7, wherein the trenches are triangular grooves and the contact frame has a triangular cross-section having a base side and two adjacent sides, the base side of the contact frame is exposed in the bottom surface of the top cover plate, and an apex of the contact frame is formed by the intersection of the adjacent sides embedded in the top cover plate.

9. A method, comprising:
    forming a top cover plate having a distal end and a proximal end, wherein the top cover plate is transparent to visible light;
    forming a contact frame on a bottom surface of the top cover plate, the contact frame comprising a first set of parallel electrically conductive lands, wherein each land of the first set is comprised of a transparent conducting material, and wherein each land of the first set is a rectangular shape bounded on a first side by the proximal end of the top cover plate, and on a second side by the distal end of the top cover plate, each land in communication with the bottom surface of the top cover plate, and having a height extending from the bottom surface of the top cover plate;
    forming a bus bar on a top surface of a bottom cover plate, the bus bar comprising a second set of parallel electrically conductive lands, wherein each land of the second set is a rectangular shape bounded on a first side by a proximal end of the bottom cover plate, and on a second side by a distal end of the bottom cover plate;
    placing an array of rows and columns of solar cell chips between the bottom cover plate and the top cover plate following the formation of the contact frame and the bus bar, each solar cell chip of the array of solar cell chips comprising an anode adjacent to a top surface and a cathode adjacent to a bottom surface of the solar cell chip, wherein the bus bar electrically contacts each cathode of each solar cell chip of the array of solar cell chips and the contact frame is in communication with the chip, the communication including the contact frame contacting each anode of each solar cell chip of the array of solar cell chips; and
    forming an opening between adjacent contact frames, the opening having a boundary extending from the bottom surface of the top cover plate to the anode and between the adjacent contact frames and extending at least the height of the lands.

10. The method of claim 9, wherein the opening is maintained in final assembly of the solar cell panel.

* * * * *